United States Patent
Gignac et al.

(10) Patent No.: US 10,386,409 B2
(45) Date of Patent: Aug. 20, 2019

(54) NON-DESTRUCTIVE DETERMINATION OF COMPONENTS OF INTEGRATED CIRCUITS

(71) Applicant: International Business Machines Corporation, Armonk, NY (US)

(72) Inventors: Lynne M. Gignac, Beacon, NY (US); Chung-Ching Lin, White Plains, NY (US); Franco Stellari, Waldwick, NJ (US)

(73) Assignee: International Business Machines Corporation, Armonk, NY (US)

( * ) Notice: Subject to any disclaimer, the term of this patent is extended or adjusted under 35 U.S.C. 154(b) by 735 days.

(21) Appl. No.: 14/854,471

(22) Filed: Sep. 15, 2015

(65) Prior Publication Data

US 2017/0074927 A1    Mar. 16, 2017

(51) Int. Cl.
G01R 31/307    (2006.01)
G01R 31/303    (2006.01)

(52) U.S. Cl.
CPC ......... *G01R 31/307* (2013.01); *G01R 31/303* (2013.01)

(58) Field of Classification Search
CPC ............................ G01R 31/307; G01R 31/303
USPC ....... 324/500, 600, 754.01–754.22; 250/307, 250/310–311; 435/307.1
See application file for complete search history.

(56) References Cited

U.S. PATENT DOCUMENTS

| | | | |
|---|---|---|---|
| 5,086,477 A * | 2/1992 | Yu | G06F 17/5068 348/87 |
| 8,390,269 B2 | 3/2013 | Noell | |
| 8,464,191 B2 | 6/2013 | McIlrath | |
| 2006/0013492 A1* | 1/2006 | Hecht | G02B 21/008 382/232 |
| 2011/0002528 A1* | 1/2011 | Bajura | G06T 7/001 382/145 |
| 2014/0172345 A1 | 6/2014 | Stoker et al. | |

OTHER PUBLICATIONS

H.G. Longbotham et al., "Nondestructive Reverse Engineering of Trace Maps in Multilayered PCBs," Conference Record on Systems Readiness: Test Technology for the 21st Century (AUTOTESTCON), Aug. 1995, pp. 390-397.

W. Li et al., "Reverse Engineering Circuits Using Behavioral Pattern Mining," IEEE International Symposium on Hardware-Oriented Security and Trust (HOST), Jun. 2012, pp. 83-88.

R. Torrance et al., "The State-of-the-Art Semiconductor Reverse Engineering," Proceedings of the 48th ACM/EDAC/IEEE Design Automation Conference (DAC), Jun. 2011, pp. 333-338.

C.-C. Lin et al., "Automatic Registering and Stitching of TEM/STEM Image Mosaics," Proceedings from the 39th International Symposium for Testing and Failure Analysis (ISTFA), Nov. 2013, pp. 152-158, vol. 7.

* cited by examiner

*Primary Examiner* — Melissa J Koval
*Assistant Examiner* — Trung Q. Nguyen
(74) *Attorney, Agent, or Firm* — Rahan Uddin; Ryan, Mason & Lewis, LLP (57) ABSTRACT

One or more contacts are detected in an electron microscope image corresponding to a region of interest on an integrated circuit. One or more standard cells are identified based on the detected one or more contacts in the electron microscope image. One or more components of the integrated circuit are determined based on the identified one or more standard cells.

20 Claims, 13 Drawing Sheets

FIG. 6A
DETECTED CAs

FIG. 6B
STANDARD CELL

FIG. 6C
CROPPED REGION

FIG. 6D
OVERLAPPING OF STANDARD CELL AND CROPPED REGION

FIG. 7A

C45H_P_DIV_LAT

FIG. 7B c45t_nfet8f2um_ha_0

FIG. 7C cr_invert_e_r_a_1081909621_1

FIG. 7D cr_invert_e_r_a_637345360_1

FIG. 8

CA MAP GENERATED BY USING A CIRCUIT LAYOUT TEXT FILE

FIG. 9B
RECTIFIED IMAGE AND DETECTED CAs

FIG. 9A
ACQUIRED AND STITCHED IMAGES

FIG. 10

FIG. 11B
DETECTION RESULTS (ZOOMED)

FIG. 11A
DETECTION RESULTS

FIG. 12B ROTATED IMAGE OF FIG. 12A

FIG. 12A CROPPED FROM STITCHED IMAGE

FIG. 13B EXTRACTED CA LAYOUT

FIG. 13A MANUAL LABELED CA

FIG. 14

NON-DESTRUCTIVE DETERMINATION OF COMPONENTS OF INTEGRATED CIRCUITS

STATEMENT REGARDING FEDERALLY SPONSORED RESEARCH OR DEVELOPMENT

This invention was made with Government support under Contract No.: HR0011-11-C-0060 awarded by Defense Advanced Research Projects Agency (DARPA). The Government has certain rights in this invention.

BACKGROUND

An integrated circuit (IC), also referred to as a chip or microchip, is a small electronic device made out of a semiconductor material, for example, silicon. ICs can be complex, each IC may include up to several billion transistors, resistors and other electronic components in a small area, and may also include numerous layers of metal.

SUMMARY

Embodiments of the invention provide techniques for non-destructive reverse engineering of an integrated circuit.

For example, in one embodiment, a method comprises the following steps. One or more contacts are detected in an electron microscope image corresponding to a region of interest on an integrated circuit. One or more standard cells are identified based on the detected one or more contacts in the electron microscope image. One or more components of the integrated circuit are determined based on the identified one or more standard cells.

DETAILED DESCRIPTION

Illustrative embodiments of the invention may be described herein in the context of illustrative methods, systems and devices for non-destructive determination of components of integrated circuits. However, it is to be understood that embodiments of the invention are not limited to the illustrative methods, systems and devices but instead are more broadly applicable to other suitable methods, systems and devices.

The term "reverse engineering" refers to understanding how an item operates or was constructed based on knowing the general function of the item and any information that can be learned by direct examination of the item itself. Reverse engineering is considered "non-destructive" if the item is still functional at the end of the reverse engineering process.

Reverse engineering of an IC can be useful for various reasons, for example, in determining whether a competitor's product contains patent infringements. Another reason for reverse engineering an IC is to confirm whether the fabrication of a particular integrated circuit conforms to the underlying design. For example, reverse engineering may be used to check for any unauthorized design modifications that may have been inserted during fabrication into ICs used in commercial and military applications.

However, traditional reverse engineering can be a time and labor consuming task. Typically, the process involves the destructive analysis of the chip layer by layer, by removing one layer at a time utilizing chemical and/or mechanical means. Subsequently, each layer is identified by a specialist. Therefore, traditional reverse engineering processes tend to be destructive and costly in terms of labor and time.

Embodiments of the invention enable non-destructive analysis of integrated circuits so that the chip may be used later for its intended purpose. Embodiments of the invention also speed up the reverse engineering process, which can benefit many areas, for example, intellectual property analysis, competitive analysis, security analysis, etc.

Transmission electron microscope (TEM), scanning transmission electron microscope (STEM), and scanning electron microscope (SEM) with integrated back-scatter electron (BSE) imaging produces high-resolution images that can be used for device diagnosis, fault detection, and characterization. For example, TEM/STEM can provide very high resolution images and information on multiple layers of a chip. Therefore, TEM/STEM imaging may be used as a tool to inspect a chip at the transistor level.

However, the resulting field of view (FOV) of a TEM/STEM image is too small to cover a large region of interest (ROI). Consequently, multiple images are usually required to generate a high resolution image that covers the entire ROI.

Embodiments of the invention provide methods and systems that enable stitching of individual high resolution TEM/STEM images into a mosaic covering the entire ROI, as well as processing the resulting mosaic to automatically identify standard cells in the ROI. Advantageously, embodiments of the invention provide methods and systems for automatic reverse engineering using high resolution TEM/STEM images. The TEM/STEM images are compiled to generate a high resolution image covering a large ROI, and circuit information are extracted and analyzed to identify one or more standard cells and determine one or more IC components.

Embodiments of the invention provide a system for creating high resolution TEM/STEM images covering large areas of ICs. The system may include: a TEM/STEM for collecting TEM/STEM images; a translating stage for moving the optical system relatively to the Device under Test (DUT); a software that controls the movement of the stage; acquisition of one or more images; and merging and/or stitching the image(s) into a single image with high resolution and large area coverage. Embodiments of the invention may also provide a method for implementing the above-described system.

Figure 1:
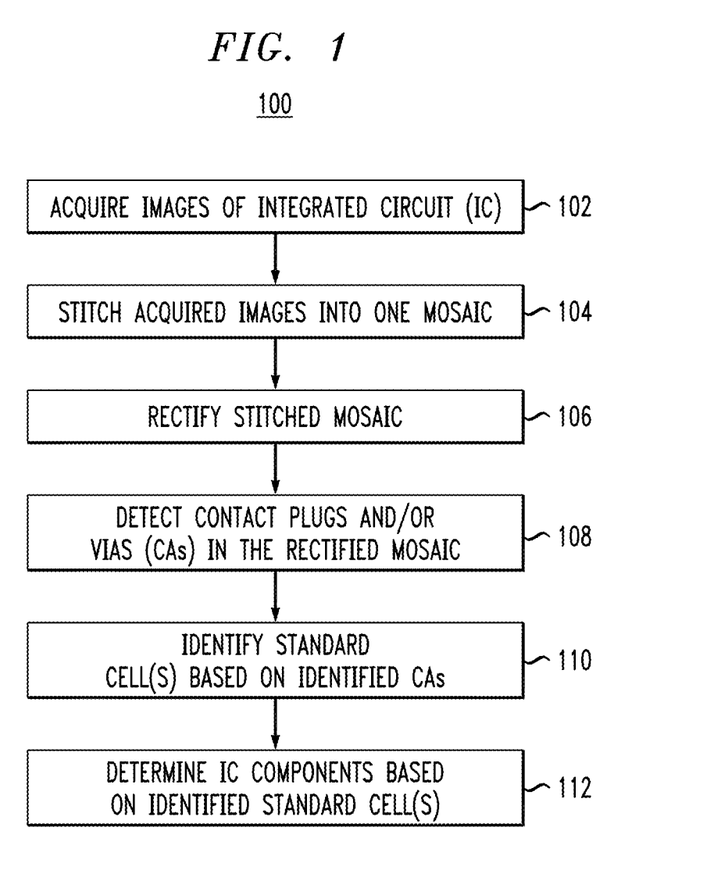
FIG. 1 illustrates an overview process of a non-destructive reverse engineering method, according to an embodiment of the invention.

Referring to the Figures, FIG. 1 depicts a non-destructive reverse engineering methodology 100 according to an embodiment of the invention. At step 102, one or more images of an integrated circuit are acquired using an electron microscope, such as a TEM or a STEM. Alternatively, the image(s) may be provided by a user or obtained from a database. At step 104, the acquired images are stitched together into one image or mosaic. In some embodiments, the acquired image(s) may have been pre-stitched or may only be one image, in which case the stitching step may be skipped. At step 106, the stitched image is rectified. At step 108, contacts (CAs), which may be tungsten contacts (plugs and/or vias), in the rectified image are identified using a detection algorithm according to embodiments of the invention. Then at step 110, one or more standard cells are identified based on the identified CAs. At step 112, one or more components of the IC are determined based on the identified standard cell(s). Details of each step of methodology 100 will be further delineated below.

Figure 2A:
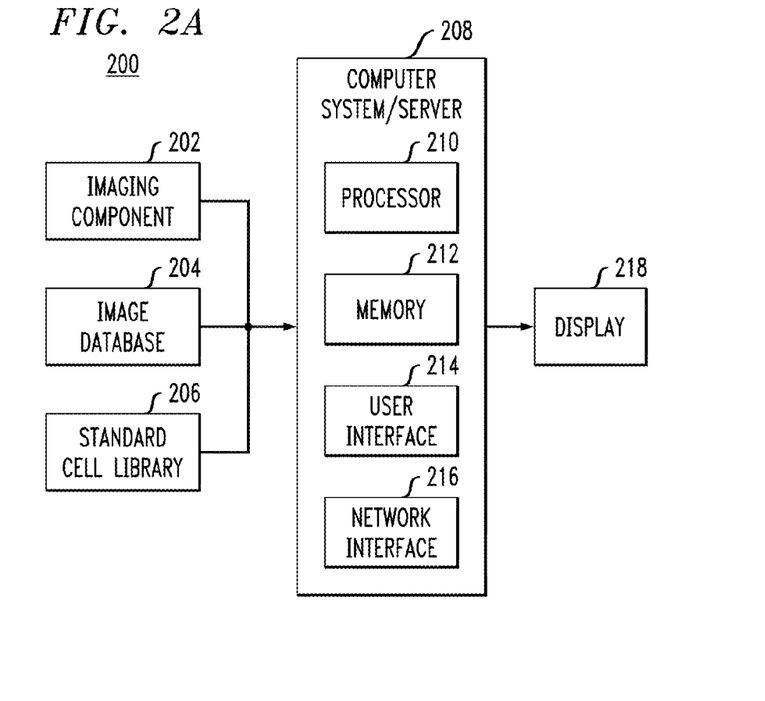
FIG. 2(a) illustrates an exemplary system for implementing the non-destructive reverse engineering method of FIG. 1.

FIG. 2(a) depicts a system 200 for implementing methodology 100 of FIG. 1. System 200 comprises imaging component 202, which may be a SEM, a TEM, and/or a STEM capable of capturing one or more images of a ROI of an IC. System 200 also comprises image database 204 which may contain previously captured and/or stitched IC images and may store images being captured by imaging component 202. System 200 further comprises a standard cell library 206 which may store standard cells of one or more ICs. System 200 also comprises a computer system/server 208 for implementing one or more algorithms to carry out one or more steps of methodology 100. Computer system/server 208 may include, but not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 208 may include one or more processor 210 coupled to a memory 212, a user interface 214 and a network interface 216. User interface 214 may be configured to enable user input into the computer system/server 208. Network interface 216 may be configured to enable the computer system/server 208 to interface with a network and other system components. System 200 also comprises a display unit 218 for presenting the results to a user on a user interface, such as for example, a computing device or suitable electronic device that enables the user to interact with system 200. It is to be appreciated that system 200 may include more or less components than shown in FIG. 2(a). For example, system 200 may include multiple ones of computer system/server 208 and may also include additional components suitable for implementing methodology 100 of FIG. 1.

Figure 2B:
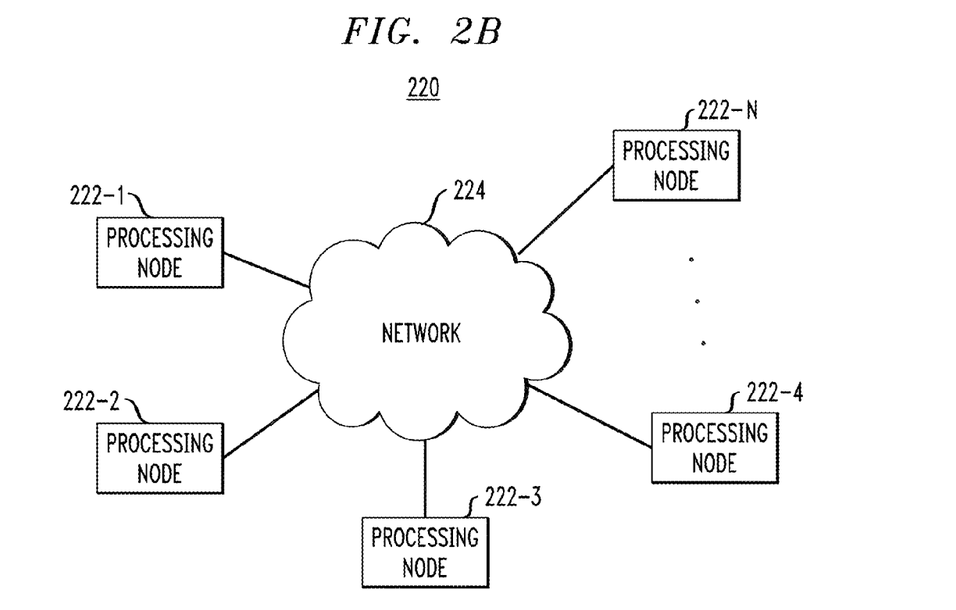
FIG. 2(b) illustrates a processing platform on which the non-destructive reverse engineering system of FIG. 2(a) may be implemented according to an embodiment of the invention.

FIG. 2(b) depicts a processing platform 220 on which the system 200 of FIG. 2(a) may be implemented. The processing platform 220 may include a plurality of processing nodes 222-1 ... 222-N which communicate with one another over a network 224. Each of the processing nodes 222-1 ... 222-N may be configured to implement the system 200 of FIG. 2(a).

Figure 3A:
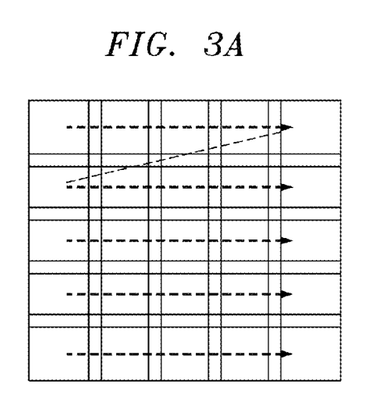
FIG. 3(a) illustrates an exemplary microscope scan pattern.
Figure 3B:
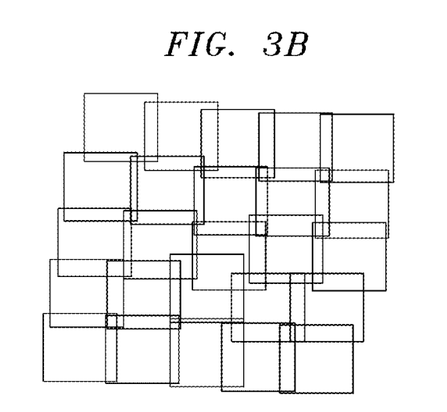
FIG. 3(b) illustrates an exemplary actual microscope stage movement, according to an embodiment of the invention.

Due to the nature of high resolution imaging, a resulting FOV tend to be small for each individual image. As such, multiple images may be required to cover an entire ROI. A scanning pattern as shown in FIG. 3(a) can be followed by the TEM/STEM to cover the entire ROI (e.g., step 102 of methodology 100 of FIG. 1). The stage movement should preferably be smaller than the FOV in order to generate an overlapping region between neighboring images. The overlapping portion of the images is later used to estimate stitch parameters. FIG. 3(b) shows an example of actual stage movement of a TEM/STEM while taking the image dataset using the scanning pattern of FIG. 3(a). It should be noted that typically, the stage movement characteristics may lead to unpredictable positioning of the images, which can create significant challenges for the subsequent stitching stage. The number of images to be captured for a ROI on an IC may vary depending on application.

Advantageously, embodiments herein provide a stitching method that accounts for: (a) potential erratic stage behavior; and (b) the highly repetitive nature of very large scale integration (VLSI) circuits, which may confuse standard algorithms.

The stitching method used in certain embodiments of the invention may comprise detecting the correspondences between adjacent frames using Harris corner detection algorithm (e.g., step 104 of methodology 100 of FIG. 1). It is to be appreciated that alternative embodiments may use other suitable detection algorithms. A matching method is developed to obtain more true positive point matches. For example, matching may be performed at the feature points detected by the Harris corner detector. Subsequently, the point matches may be further refined using a random sample consensus (RANSAC) method. To estimate stitching parameters, an efficient bundle adjustment method with Levenberg-Marquardt algorithm is developed and a weighting strategy to make the estimation more robust is proposed.

After the captured images are stitched into one mosaic or image, the stitched image is then rectified to correct any tilting that may have resulted from erratic stage behavior while the individual images were captured (e.g., step 106 of methodology 100 of FIG. 1).

Each integrated circuit includes numerous CAs, e.g., tungsten contacts (plugs and/or vias), that connect transistors and interconnecting layers of an integrated circuit. A plug is a vertical connection between metal lines in multilevel interconnect scheme, while a via is a hole etched in the interlayer dielectric which is then filled with metal to provide vertical connection between stacked up interconnect metal lines.

CAs are crucial elements in an IC because they create the connections and develop different functionalities of an IC. Moreover, each CA provides a strong signal in TEM/STEM imaging because of the CA material's characteristic. Therefore, a CA constellation (e.g., the configuration or arrangement of CAs in a standard cell) can provide important and reliable information for automatic analysis of components of an IC. Advantageously, embodiments herein provide a method to identify CAs in BSE/STEM/TEM mosaics.

Figure 4:
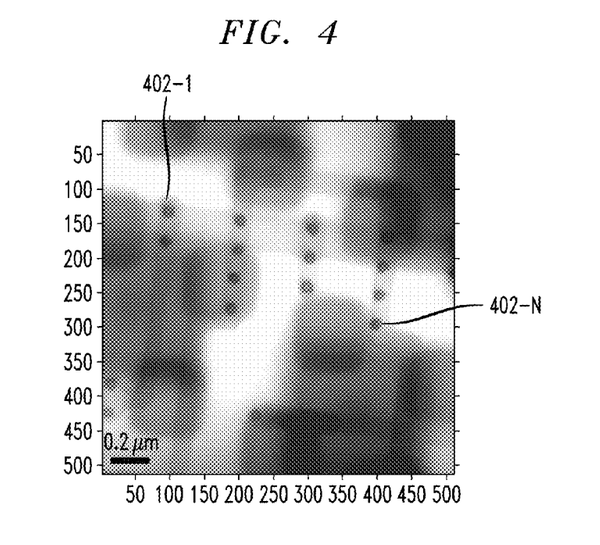
FIG. 4 illustrates a region of an integrated circuit captured using scanning transmission electron microscope, according to an embodiment of the invention.

FIG. 4 shows an exemplary image captured using TEM/STEM. As shown in FIG. 4, the shape of CAs 402-1 . . . 402-N are circular. One or more electron microscope images, such as that shown in FIG. 4, may be analyzed to detect CAs using detection algorithms described herein.

Figure 5A:
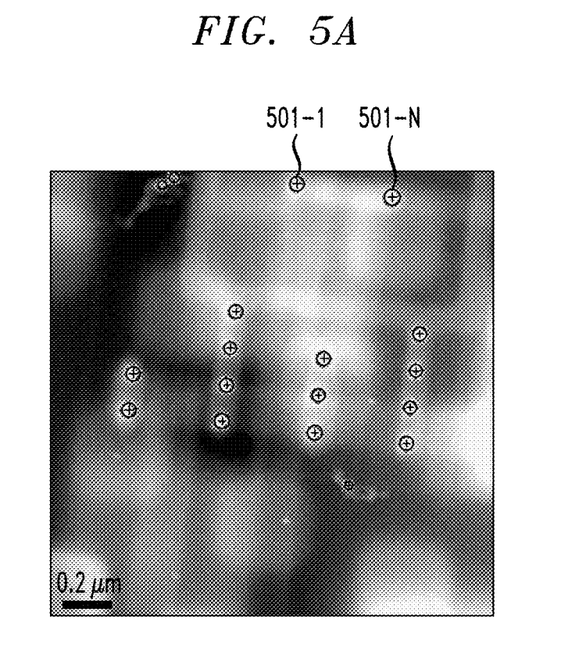
FIG. 5(a) illustrates exemplary contact (CA) detection results using the non-destructive reverse engineering methodology of FIG. 1.
Figure 5B:
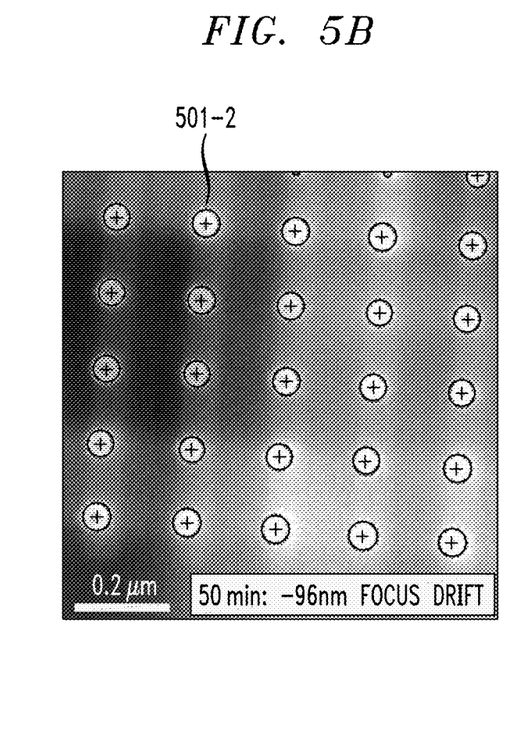
FIG. 5(b) illustrates a close-up of the CA detection results taken from a different region of the chip, according to an embodiment of the invention.

FIGS. 5(a) and 5(b) show illustrative representations of detected CAs 501-1 . . . 501-N in TEM/STEM images. FIG. 5(b) is a close-up (zoomed-in) version of one portion of FIG. 5(a). As shown in FIGS. 5(a) and 5(b), each detected CA is represented as a circle with a "+" at the center of the circle. Embodiments herein uses a general Hough transform to detect each circle in the rectified stitched image (e.g., step 108 of methodology 100 of FIG. 1). After the circles are detected, the results include the centers and radii of the circles in pixels. As shown in FIGS. 5(a) and 5(b), the "+" signs indicate the centers of the detected CAs and circles indicate the size of the detected CAs. The detected circles are then used to create a CA constellation of the ROI. Due to the noise and focus drift while acquiring the TEM/STEM image sets, noise reduction and edge enhancement techniques are also applied on the images to improve CA detection performance. An adaptive filter may be used to adjust the filter coefficients by analyzing the local mean and variance, and an unsharp mask filter may be used to improve the contrast on the edges.

Different techniques are used to design and fabricate integrated circuits. For example, one technique is the "cell-based method", in which an integrated circuit is seen as a combination of "standard cells", each cell typically comprising one or more transistors, each implementing a basic function. A standard cell may be a logic gate, a memory cell, or may implement a more complex function (flip-flop, adder, multiplexor, etc.). Generally, a standard cell may comprise the following information: a transistor netlist detailing the cell inputs, outputs, and connections between transistors; and a two-dimensional topographic view or "layout" of the cell as it will be fabricated. In order to reverse engineer an integrated circuit, a library of the different standard cell layouts present in the integrated circuit is first built. Subsequently, a pattern recognition method (automatic or manual) may be used to identify the cell layout, find the interconnections between the standard cells, and discover the functionalities of the integrated circuit.

Referring back to the process of identifying components in an IC according to embodiments of the invention, standard cells are identified from the rectified stitched TEM/STEM image using the CA constellation created from the detected CAs. In order to identify the standard cells in the rectified stitched image, a set of golden CA maps is created using a standard cell library. As used herein, a "golden CA map" is a reference CA map. The standard cell library may be created by manually selecting one or more standard cells, or the standard cell library may be built automatically. For example, given a library of standard cell that is available in the design kit used to design the circuit, one can process the layout information to create the golden CA maps used during the detection process. This can be done exhaustively for all cells in the library or for a selected number of cells, either manually or based on usage statistics.

Each golden CA map is compared against the CA constellation in the chip. Four orientations are compared for each golden CA map: 1) original; 2) 180 degree rotation; 3) flipped or mirrored around the x-axis; and 4) flipped or mirrored around the y-axis. For tolerance against CA detection error, detection bias, and stitching error, the comparison is made map to map. Embodiments of the invention use oversampling to tolerate small errors and bias.

A confidence rate is used in evaluating the standard cell detection method used in embodiments of the invention. A "rate" is designed to evaluate the confidence of detections. The confidence rate, P, considers the CA hits and CA misses, and is calculated as follows:

$$P = P1 * P2$$

P1: CA number ratio
P2: unique hit ratio
$N_{sc}$: CA number of the standard cell
$N_{cc}$: CA number of the cropped region in the chip. The cropped region is the same size as the standard cell.
$N_{uniqueHit}$: the number of the CAs that has overlapping area in both CA maps, e.g., as shown in FIGS. 6(b) and 6(c).

$$P1 = \begin{cases} \frac{N_{cc} - (N_{cc} - N_{uniqueHit})}{N_{sc}}, & N_{sc} >= N_{cc} \\ \frac{N_{sc} - 2(N_{cc} - N_{uniqueHit})}{N_{sc}}, & \text{otherwise} \end{cases}$$

$$P2 = \frac{N_{uniqueHit}}{N_{sc}}$$

Figure 6A:
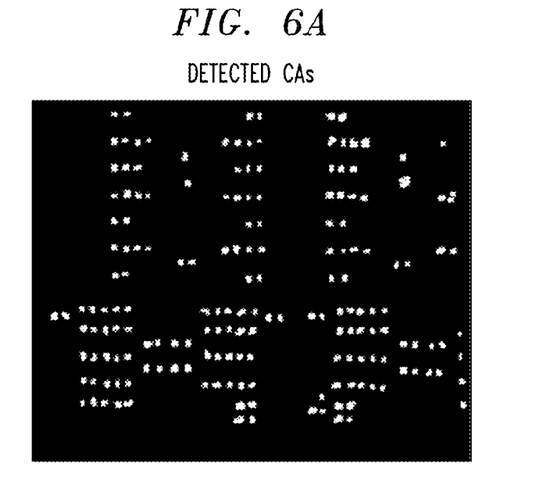
FIGS. 6(a)-(d) illustrate a cell matching process used in the non-destructive reverse engineering methodology of FIG. 1, according to an embodiment of the invention.
Figure 6B:
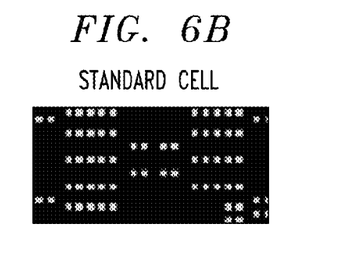
Figure 6C:
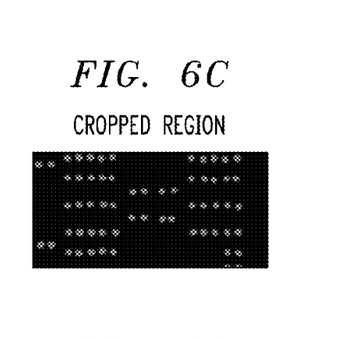
Figure 6D:
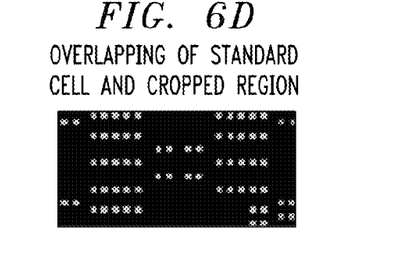

FIGS. 6(a)-(d) depict an exemplary cell matching process used in the non-destructive reverse engineering methodology 100 of FIG. 1. FIG. 6(a) shows the detected CAs, FIG. 6(b) shows a standard cell CA map (e.g., from a standard cell library), FIG. 6(c) shows a cropped region of the detected CAs, and FIG. 6(d) shows an overlapping of the standard cell CA map and cropped region CA map.

In some embodiments, detection is performed at every pixel on the CA map (i.e., CA constellation) of the chip. In other embodiments, in order to detect standard cells more efficiently, detection is not performed at every pixel on the CA map of the chip. Instead, detection is only performed at the pixels corresponding to detected CA centers. This method can be applied in different conditions. For example, in one embodiment, the method can be applied successfully in the "perfect" or ideal condition. Under the ideal condition, the CA constellation of the chip is generated using a layout text file.

Figure 7A:
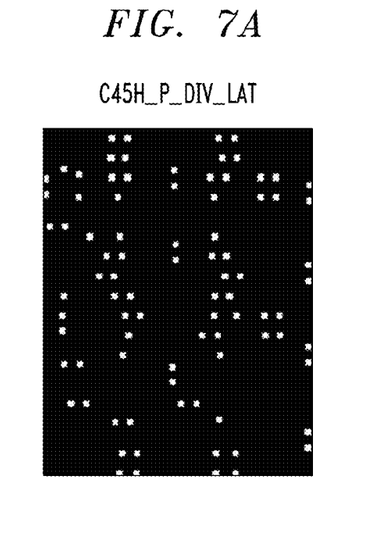
FIGS. 7(a)-(d) illustrate different exemplary standard cells with different levels of complexity/size, according to an embodiment of the invention.
Figure 7B:
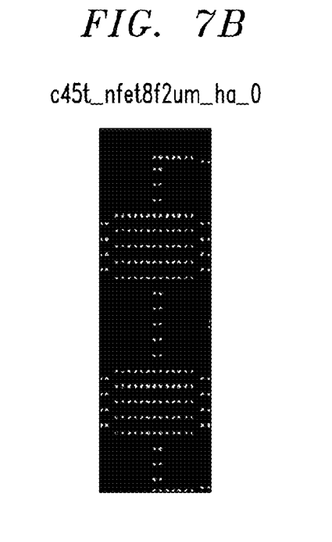
Figure 7C:
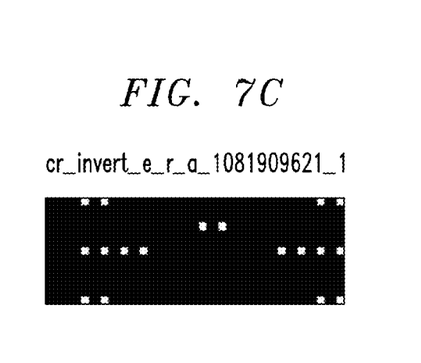
Figure 7D:
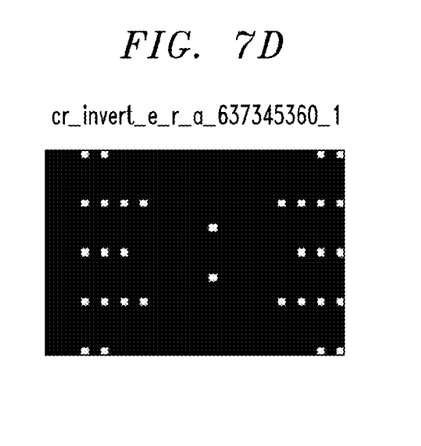

FIGS. 7(a)-(d) show different exemplary standard cells with different levels of complexity/size. For example, FIG. 7(b) shows a larger and more complex standard cell relative to the standard cell shown in FIG. 7(c)

Figure 8:
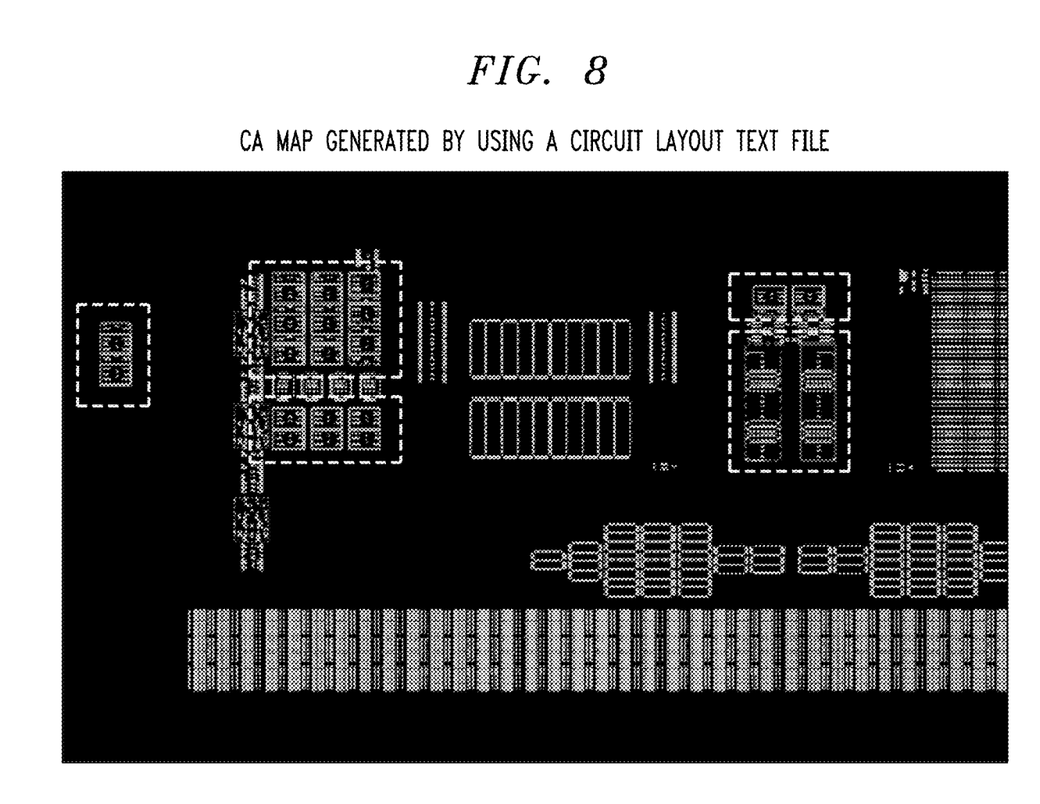
FIG. 8 illustrates a CA map generated using a layout text file, according to an embodiment of the invention.

FIG. 8 shows a portion of the CA constellation generated by using the circuit layout text file. The dash-lined boxes show the detection results on the CA constellation, each dash-lined box represents a different standard cell. Only a limited number of standard cells are shown in the CA constellation for illustrative purposes. Therefore, not all the CAs are covered/shown by the detection results.

Figure 9A:
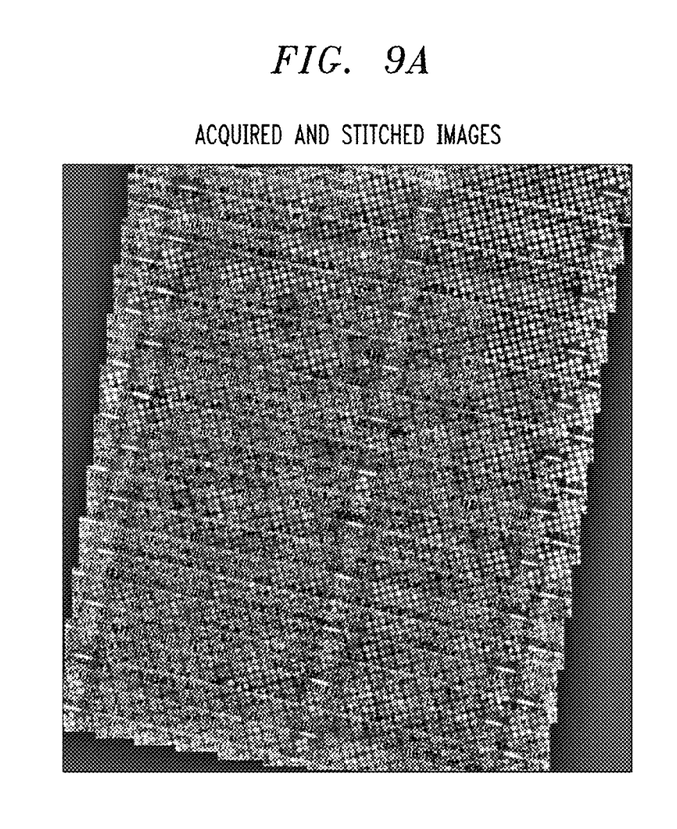
FIG. 9(a) illustrates an exemplary mosaic of acquired and stitched images; and 9(b) illustrates the rectified mosaic of FIG. 9(a) with detected CAs, according to an embodiment of the invention.
Figure 9B:
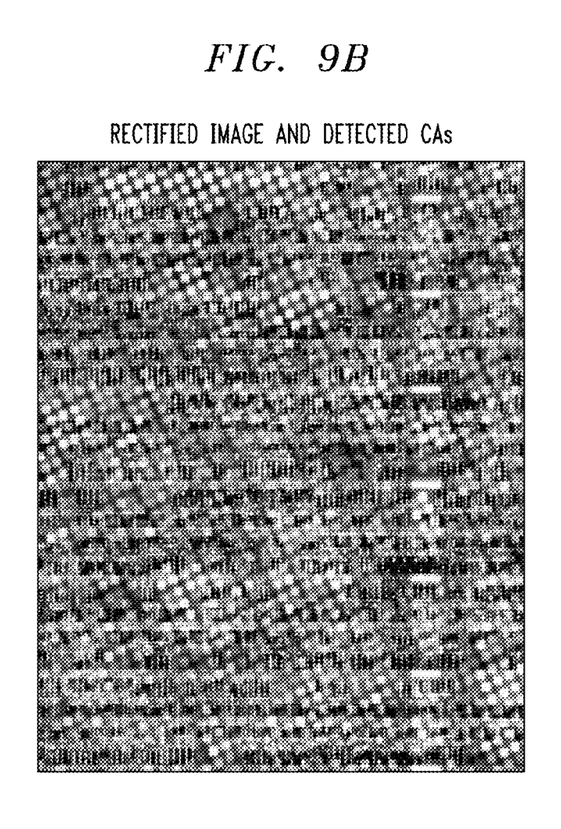

In another illustrative embodiment, the methodology 100 of FIG. 1 was tested on a test article (e.g., an integrated circuit) as follows. TEM/STEM images were captured/acquired at a ROI. The acquired images were then stitched together using the stitching process described above. FIG. 9(*a*) shows the acquired and stitched images for the ROI of the test article. After rectification of the stitched image, CA detection is then performed on the rectified stitched image. FIG. 9(*b*) shows an overlay of the rectified stitched image with the CA detection results (i.e., CA constellation).

Separately, a known library of CA constellation that correspond to gates should be created. The library can be drawn from the layout directly (e.g., FIG. 8) or by manual analysis and reverse engineering of a small portion of the measured circuit.

In this instance, standard library information was not readily available for the test article, and a CA map library was created manually. A small library was created by manually selecting individual standard cells from the rectified stitched image and manually grouping them together to create a standard cell based on the manual analysis by an expert user.

Figure 10:
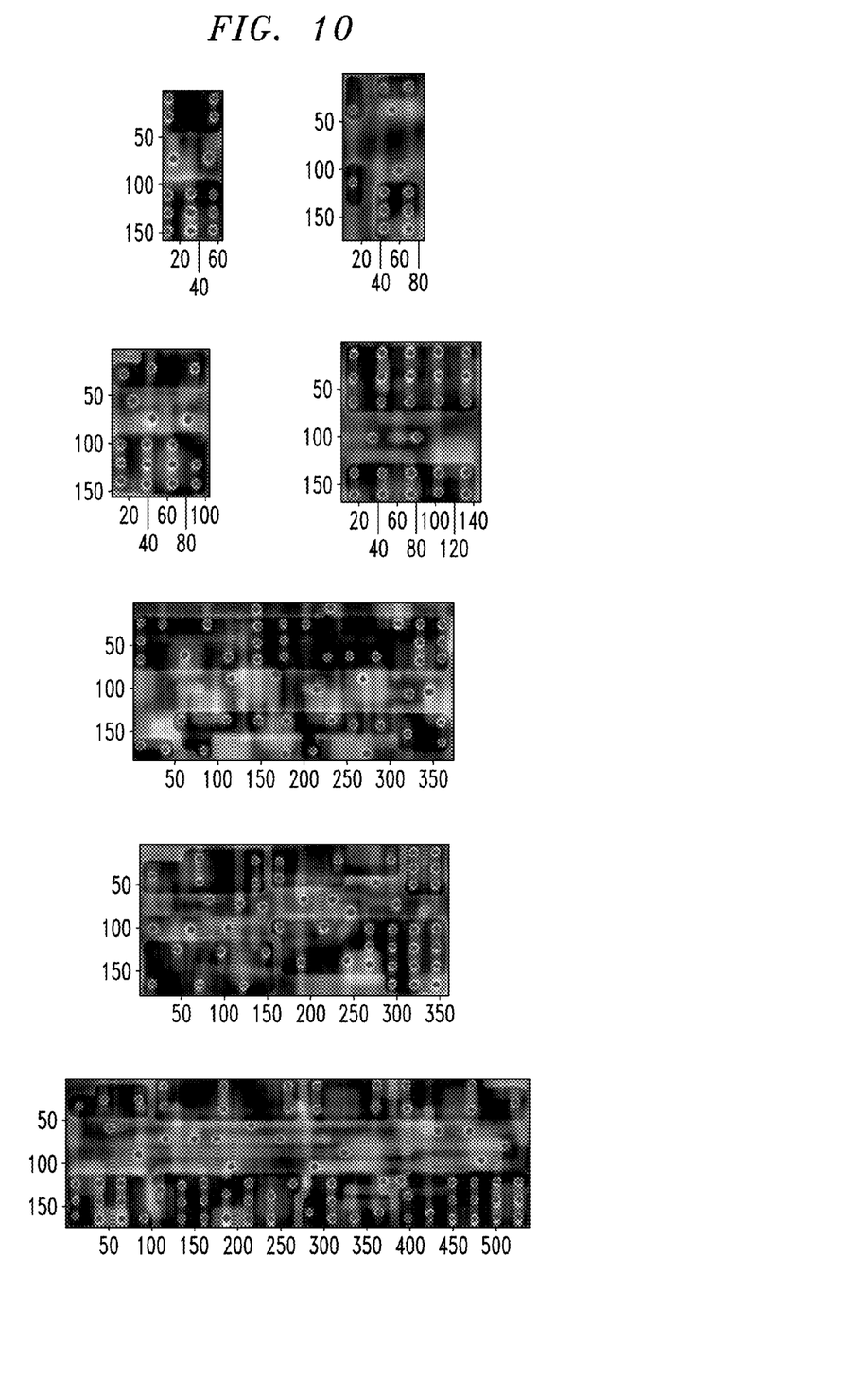
FIG. 10 illustrates an exemplary standard cell library created from standard cells manually selected from the stitched mosaic of FIG. 9(b), according to an embodiment of the invention.

FIG. 10 shows examples of manually selected standard cells in the standard cell library. The standard cell library is then used to detect standard cells in the stitched image.

Subsequently, we pick each known library cell and search for it in the CA constellation of the circuit under test. When one is found based on detection algorithms described herein, we represent it with a box as shown in FIGS. 11(*a*) and 11(*b*).

Figure 11A:
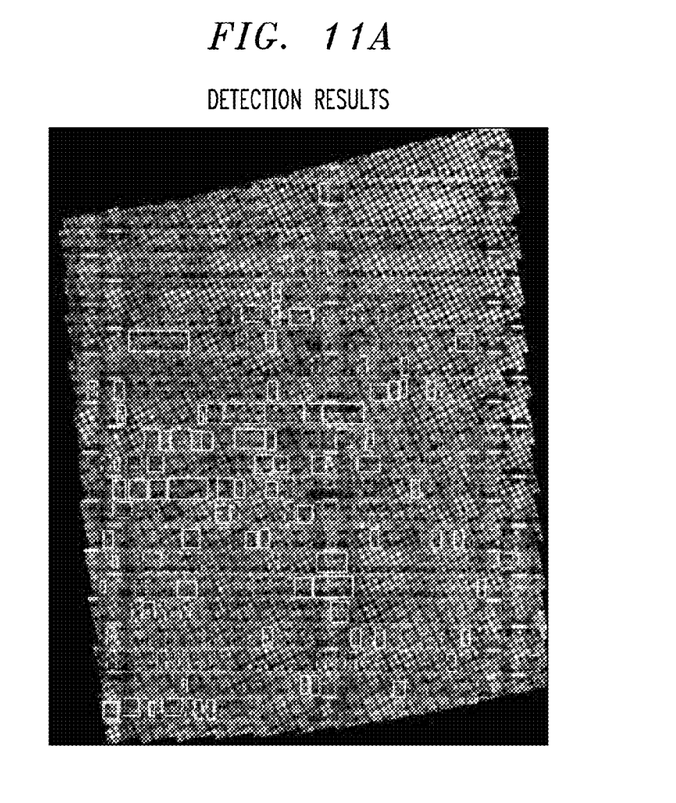
FIGS. 11(a) and 11(b) illustrate exemplary detection results using the standard cell library of FIG. 10, according to an embodiment of the invention.
Figure 11B:
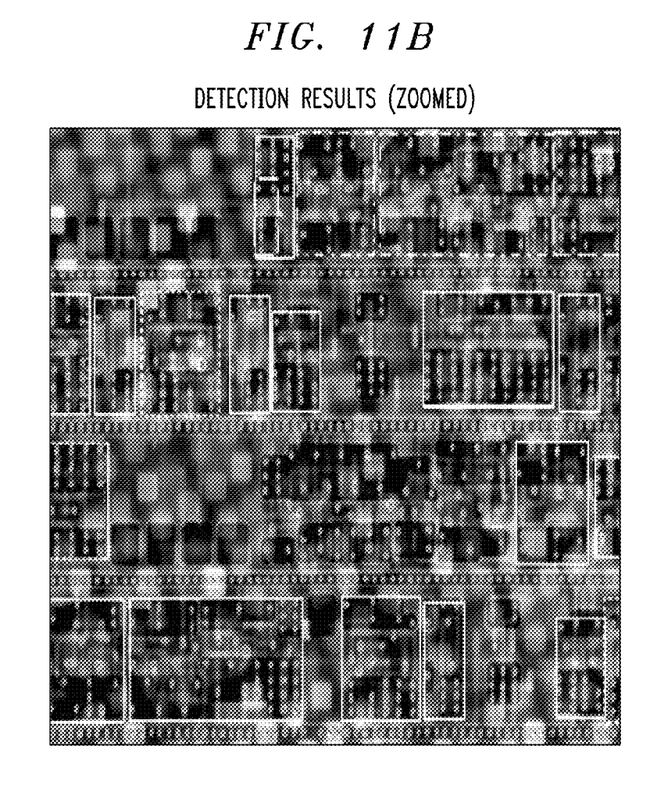

FIGS. 11(*a*) and 11(*b*) show the CA detection results using the standard cell library and the CA constellation of FIG. 9(*b*). FIG. 11(*b*) is a zoomed-in version of a portion of the detection results shown in FIG. 11(*a*). In the stitched image, about 12,000 (12 k) CAs are detected and about 4.8 k (38%) of the detected CAs are power supply ($V_{DD}$) and ground (GND); 7.8 k of the detected CAs are random logic, 43% of the detected CAs were identified by the standard cell library created from manually selected standard cells and 57% of the detected CAs were unidentified. However, it should be appreciated that the detection rate can be significantly increased by building a larger library of standard cells.

Figure 12A:
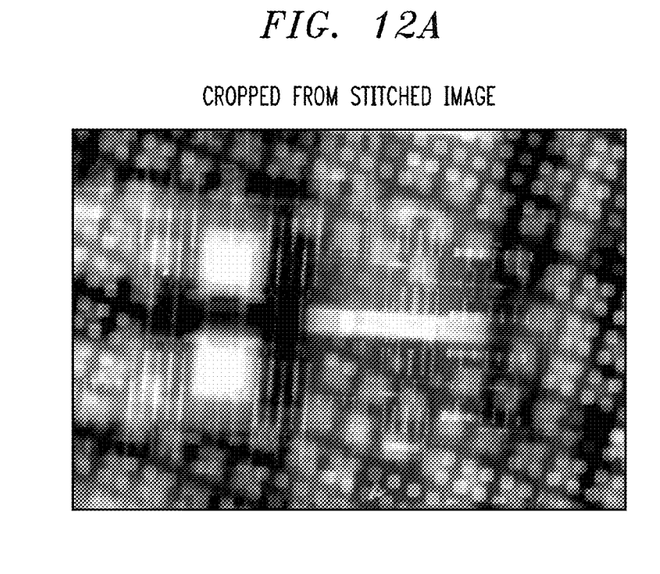
FIG. 12(a) illustrates another example of a portion of an image stitched together from acquired images.
Figure 12B:
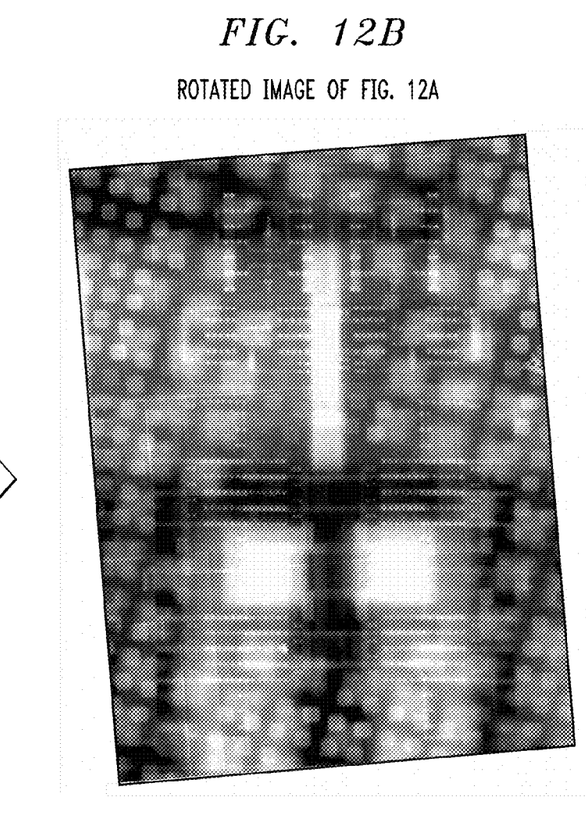
FIG. 12(b) illustrates a rotated image of FIG. 12(a), according to an embodiment of the invention.

In yet another alternative embodiment, the methodology 100 of FIG. 1 can be applied using CA constellations manually generated from the BSE/TEM/STEM images. FIG. 12(*a*) shows a portion of a stitched image that comprises a plurality of BSE/TEM/STEM images having been stitched into one mosaic according to the stitching method described above. FIG. 12(*b*) shows the rectified stitched image of FIG. 12(*a*), the stitched image having been rotated for the CAs to align horizontally and vertically.

Figure 13A:
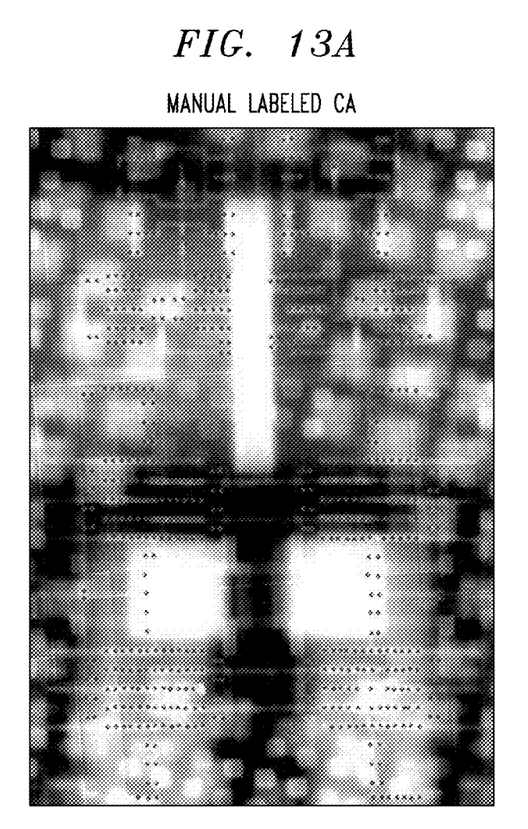
FIG. 13(a) illustrates manually labeled CAs in the image of FIG. 12(b)
Figure 13B:
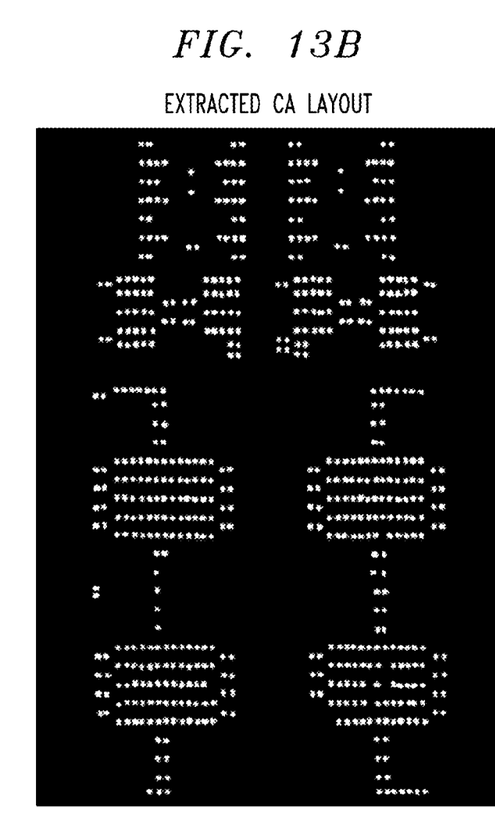
FIG. 13(b) illustrates a CA map automatically generated based on a detection algorithm according to an embodiment of the invention.

FIGS. 13(*a*) and 13(*b*) show CAs labeled on the image of FIG. 12(*b*). The dots in FIG. 13(*a*) show the manually labeled CAs overlay with the rectified image, and the dots in FIG. 13(*b*) show the CAs in the CA map automatically generated based on the detection algorithm used in embodiments of the invention. As shown, the manually labeled CA map is different from the automatically generated CA map. The sizes and the positions of manually labeled CAs are unstable, as CA distances may be different between the manual or automatic extractions. Preferably, the images are adjusted to the same ratio. Since distances between CAs have some patterns to follow, e.g., the distance may be consistent from one CA to the next or from one set of CAs to another set of CAs, the adjustment can be estimated using the observed distance between CAs. After we adjust the images to have the same ratio, the detection algorithm according to steps 108 and 110 of methodology 100 can be performed on the adjusted image.

Figure 14:
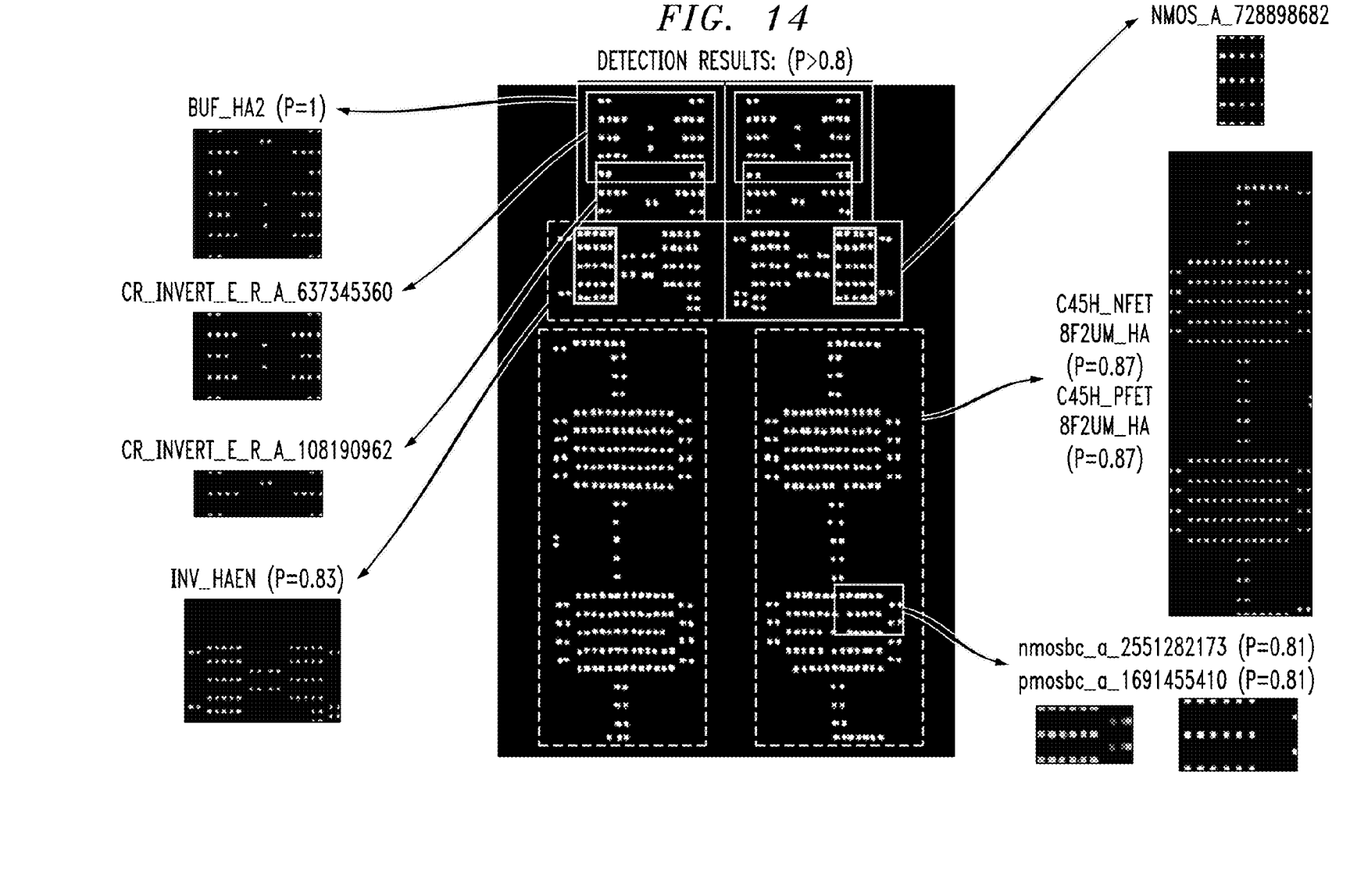
FIG. 14 illustrates detection results using the methodology of FIG. 1 on the image of FIG. 13(b), with a confidence rate above 0.8.

FIG. 14 shows the detection results using methodology 100 with a requested confidence rate above 0.8. The boxes with solid lines show the detection with a confidence value of one (or 100%), and the boxes with dash lines show the detections with a confidence value of less than one but greater than 0.8 (or 80%). The boxes with the same color show the same type of standard cell. The correspondent CA golden maps are shown on the peripheral of the detection result. On the top of the detection result are the detected buffers (BUF_HA2) that contains two different inverters, CR_INVERT_E_R_A_637345360 and CR_INVERT_E_R_A_108190962, which share certain CAs corresponding to $V_{DD}$/GND. This detection result is consistent with the result obtained under the "perfect condition" using the ideal CA constellation derived from the layout text file. In FIG. 14, all CAs are covered by the detection result. The result shows that methodology 100 is robust enough to account for noises, including stitching error, CA locations error, CA sizes error and missing CAs.

Embodiments of the invention also provide for detection of chip alterations and counterfeits by comparing the acquired TEM/STEM images with layout information. Using methodology 100, we can stitch and rectify the acquired TEM/STEM images, and generate a golden map of CA constellation at a ROI area using a layout text file. The golden map is taken as a big standard cell. The golden CA map may be generated using the standard cell library, and an extracted CA constellation may be generated using the CA detection methodology described herein or by manual labeling. Then, we can compare the golden CA map with the CA constellation extracted from the rectified TEM/STEM image.

Once we have the highest match setting (e.g., orientation), we can overlay the image and highlight the difference between the golden CA map and the CA constellation extracted from the rectified image. It would then be possible to identify any extra hardware included in the IC and detect potential chip alterations. In fact, it should be understood that alterations of the front-end of line require CA contacts to activate the inserted circuit.

Embodiments provided herein also speed up infringement investigation in patent lawsuits. For example, we can create a panorama of the ROI in a chip made by a different company and check for similarities and differences.

The present invention may be a system, a method, and/or a computer program product at any possible technical detail level of integration. The computer program product may include a computer readable storage medium (or media) having computer readable program instructions thereon for causing a processor to carry out aspects of the present invention. For example, computer system/server 208 may comprise a computer program product for implementing embodiments of the invention disclosed herein.

The computer readable storage medium (e.g., memory 212) can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network (e.g., network 224), including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   detecting one or more contacts in an electron microscope image captured by an electron microscope corresponding to a region of interest on a multilevel integrated circuit, wherein the one or more contacts are a vertical connection between metal lines in the multilevel integrated circuit;
   identifying one or more standard cells based on the detected one or more contacts in the electron microscope image; and determining one or more components of the integrated circuit based on the identified one or more standard cells;

wherein the detecting, identifying and determining steps are performed by at least one processor coupled to a memory, wherein the processor is configured to implement one or more algorithms to carry out the identification of the one or more standard cells.

2. The method of claim 1, wherein the electron microscope image is a mosaic comprising a plurality of electron microscope images for the region of interest.

3. The method of claim 2, further comprising stitching the plurality of electron microscope images into the mosaic.

4. The method of claim 3, wherein stitching the plurality of electron microscope images comprises utilizing a feature detection algorithm.

5. The method of claim 3, further comprising rectifying the stitched mosaic.

6. The method of claim 5, wherein rectifying the stitched mosaic comprises aligning the images at least one of horizontally and vertically.

7. The method of claim 1, wherein detecting the one or more contacts comprises utilizing a Hough transform.

8. The method of claim 1, further comprising creating a contacts constellation for the region of interest based on the one or more detected contacts.

9. The method of claim 8, wherein the contacts constellation comprises the arrangement of the contacts in the region of interest.

10. The method of claim 8, further comprising creating one or more contact reference maps from a standard cell library for the region of interest.

11. The method of claim 10, wherein identifying one or more standard cells comprises comparing the contacts constellation to the one or more contact reference map.

12. The method of claim 10, wherein determining one or more components of the integrated circuit comprises identifying similarities and differences based on the comparison of the contacts constellation to the one or more contact reference map.

13. The method of claim 10, wherein the one or more contact reference maps is one of created automatically using a layout text file and created manually by a user.

14. The method of claim 10, further comprising comparing four orientations of each contact reference map against the contacts constellation.

15. The method of claim 14, wherein the four orientations comprise a given contact reference map, a 180 degree rotation of the given contact reference map, the given contact referenced map flipped around the x-axis, and the given contact reference map flipped around the y-axis.

16. The method of claim 1, further comprising calculating a confidence rate for the one or more detected contacts.

17. The method of claim 1, wherein the electron microscope image is acquired by an imaging component.

18. The method of claim 1 wherein the electron microscope image is received from one of a database and a user.

19. The method of claim 1, wherein the electron microscope is one of a transmission electron microscope, a scanning transmission electron microscope, and a scanning electron microscope.

20. The method of claim 1, wherein the one or more contacts are one or more tungsten contacts.

* * * * *